United States Patent [19]

Sullivan

[11] Patent Number: 4,948,108

[45] Date of Patent: Aug. 14, 1990

[54] CIRCUIT BOARD SUPPORT DEVICE

[75] Inventor: Harold M. Sullivan, Ontario, Calif.

[73] Assignee: McDonnell Douglas Corporation, Long Beach, Calif.

[21] Appl. No.: 197,229

[22] Filed: May 23, 1988

[51] Int. Cl.⁵ .............................................. B25B 1/20
[52] U.S. Cl. ..................................... 269/903; 269/43; 269/304; 269/305
[58] Field of Search ................... 269/43, 45, 903, 118, 269/203, 289 R, 291, 303–306

[56] References Cited

U.S. PATENT DOCUMENTS

| 621,022 | 3/1899 | Boal | 51/217 R |
|---|---|---|---|
| 3,826,483 | 7/1974 | Siegel | 269/903 |
| 4,030,717 | 6/1977 | Serlousky | 269/903 |
| 4,421,305 | 12/1983 | Kosmowski | 269/903 |

Primary Examiner—J. J. Hartman
Attorney, Agent, or Firm—Curt L. Harrington; George W. Finch; John P. Scholl

[57] ABSTRACT

A particularly useful circuit board support device is disclosed which provides a rigid protected environment for a circuit board during curing, transport, testing and assembly. The circuit board support devices are modular and may be stackably rigidly joined into convenient multiple units.

4 Claims, 5 Drawing Sheets

CIRCUIT BOARD SUPPORT DEVICE

BACKGROUND OF THE INVENTION

The process of circuit board assembly involves several stepwise operations requiring repeated handling of each circuit board. The placement of components on the board can be done in assembly line fashion in the case of mass production, but there will still be some operations performed in a batch fashion such as testing. Each time the circuit boards are handled, the danger of damage to the board increases. This is due to the structural deficiencies of the board and to the delicacy of the circuit components. As circuit boards and the circuit elements they carry become smaller due to advances in technology, the assembled board becomes increasingly susceptible to damage.

Events which carry with them an increased possibility of damage include component insertion, packing and unpacking in preparation for transport, and physical manipulation for testing. Each time the circuit boards are placed near a surface having a different voltage potential, the danger of static discharge into the circuit elements on the board is increased. High voltage, low current potentials of thousands of volts are present in static discharges, and can totally destroy semiconductor circuit elements.

Adequate structural support must also be provided whenever the board is physically manipulated. When circuit elements are added to the board on one side, the reverse side may be damaged by the surface on which it is supported. Proper structural support must also be provided during heat treatment operations. When adhesives are used the circuit boards must be cured in a high temperature environment. The circuit board must be properly supported to insure even heating and adequate circulation of air around the board.

SUMMARY OF THE INVENTION

The device of the present invention provides a sturdy support for a circuit board. The circuit board is firmly and evenly clamped to the support. The support holds the circuit board recessed from the edges of the support. The recessed circuit board, when placed upon a planar surface, will not suffer damage resulting from irregularities in the circuit board surface. The circuit board may be left in the support during many operations. The board may be assembled, tested, cured, and stacked for transport while attached to the support.

The circuit board support has external latches to fasten it to other circuit board supports. This feature enables stacks of circuit board supports to be constructed to facilitate shipping and storage. Each circuit board support is provided with adjustable support means in order to enable one circuit board support to fixable support almost any size circuit board having dimensions smaller than the circuit board support.

The circuit board support herein is economically advantageous since it can be constructed from readily available bar stock. The dimensions are not critical and need only be of sufficient scale to encompass the size circuit board desired. The hardware required for assembly comprises nut plates, wing nuts, carriage bolts, and latches.

BRIEF DESCRIPTION OF THE DRAWINGS

The above mentioned and other features of this invention will become more apparent by reference to the following description taken in conjunction with the accompanying drawings, in which.

DESCRIPTION OF THE PREFERRED EMBODIMENTS

Figure 1:
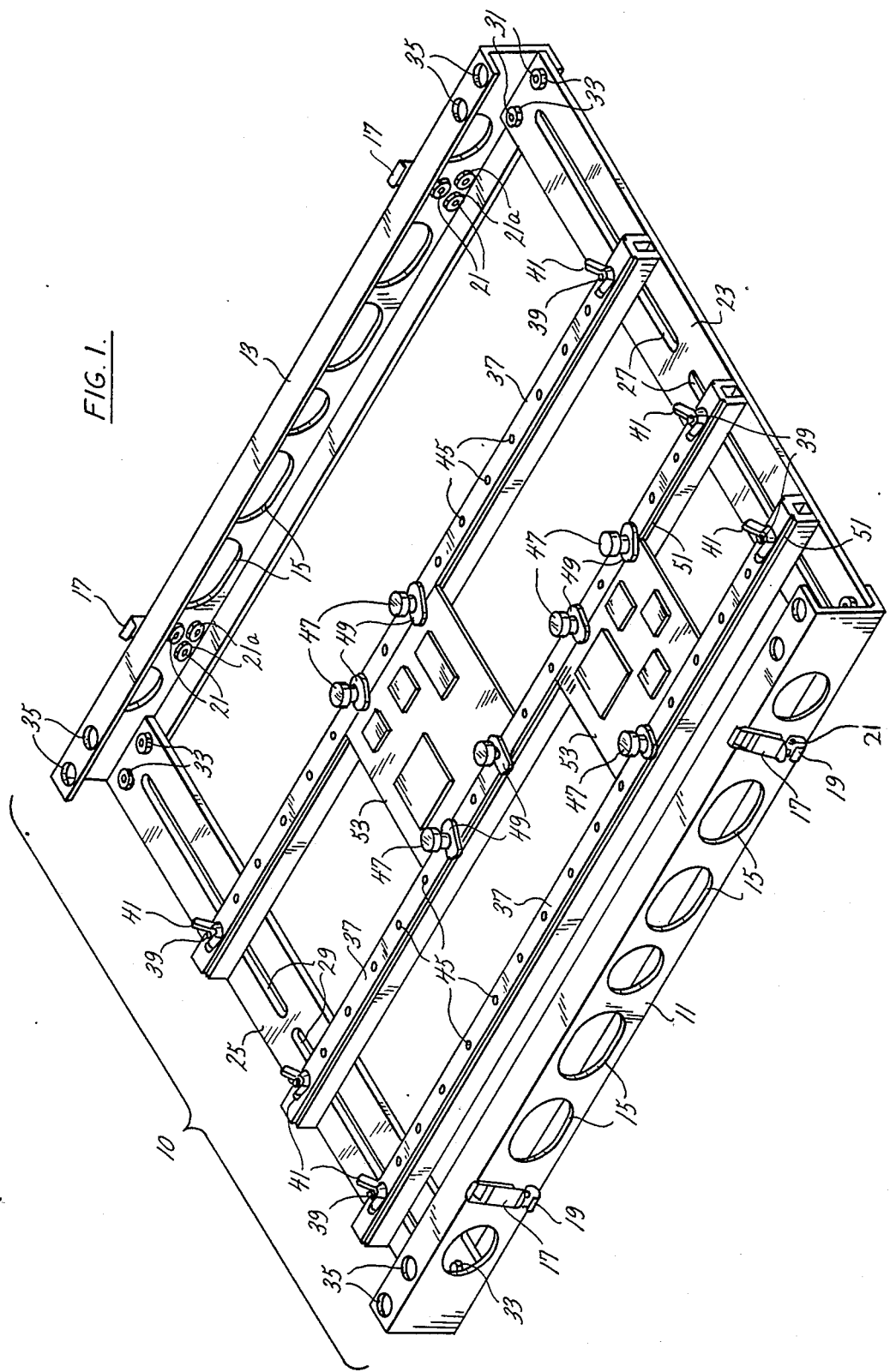
FIG. 1 is an perspective view of the circuit board support device of the present invention.

Referring to FIG. 1, there is shown the circuit board support device of the present invention, generally labeled 10. Circuit board support device 10 may be constructed of any material, including anodized aluminum or steel. A pair of C shaped side supports 11 and 13 have a series of apertures 15. Side support 11 has a pair of moveable attachment members, or latches, 17. Side support 11 also has a pair of fixed attachment members, or hooks 19, located just below the latches 17. Side support, 13, similarly has a pair of latches 17 and hooks 19 but are not directly observable in FIG. 1 because they are outwardly disposed in a direction away from the observer of FIG. 1. Latches 17 and hooks 19 are ideally fixably attached to the side supports 11 and 13 by means of bolts 21 secured by nuts 21a.

A cross support 23 rigidly joins the bottom of one end of side support 11 to the bottom of one end of side support 13. A cross support 25 rigidly joins the bottom of the other end of side support 11 to the the bottom of other end of side support 13. Cross support 23 has a pair of colinear, separated elongate slots 27. Cross support 23 has a pair of colinear, separated elongate slots 29.

The ends of cross supports 23 and 25 are rigidly joined to the bottom of the ends of side supports 11 and 13 by means of a multiplicity of bolts 31 threadably engaged with their associated nuts 33. The top of the ends of side supports 11 and 13 each have a pair of bolt head clearance apertures 35, which are coaxial with the bolts 31.

A series of circuit board support bars 37 are oriented parallel to side supports 11 and 13. One of the ends of each of the circuit board support bars 37 is fixedly attached to cross support 23 while the other of the ends of each of the circuit board support bars 37 is fixedly attached to cross support 25. Circuit board support bars 37 are fixedly attached to cross supports 23 and 25 by means of bolts 39 threadably attached to wing nuts 41 which pass through large apertures 43 in the ends of circuit board support bars 37, and through elongate slots 27 and 29 in cross supports 23 and 25 respectively.

Circuit board support bars 37 are U shaped channel members which have a series of threaded apertures 45 along their length. Screwably fittable into threaded apertures 45 are any number of thumb bolts 47. Each thumb bolt 47 is insertable through and screwably secures a wing clamp 49. Each circuit board support bar 37 has a pair of grooves 51 which extends over its length. A circuit board 53 is shown fitted within grooves 51 between a pair of circuit board support bars 37, and securable by means of thumb bolts 47 and wing clamps 49.

The assembled circuit board support device shown in FIG. 1 is especially suited for carriage of circuit boards 53. Since circuit board support bars 37 fit low on side supports 11 and 13, circuit board 53 fits low and therefore has a good upper clearance. Wing nuts 41, bolts 39, and elongated slots 27 and 29 on cross supports 23 and 25 allow lateral adjustment of each circuit board support bar 37 in order to accommodate circuit boards 53 of differing size.

The apertures 15 in the sides of side supports 11 and 13 allow easy handling of the circuit board support device. Apertures 15 also allow adequate ventilation when the circuit board support device is used to support circuit board 53 during curing operations.

An important feature of the circuit board support device of FIG. 1 is its ability to be attachably stacked to other circuit board support devices to form a stable unit. Each of the four latches 17 are capable of reaching upward to grasp the four hooks 19 of an upwardly adjacent circuit board support device. Similarly each of the four hooks 19 are capable of being grasped by the upward reaching latches 17 of a lower adjacent circuit board support device.

Figure 2:
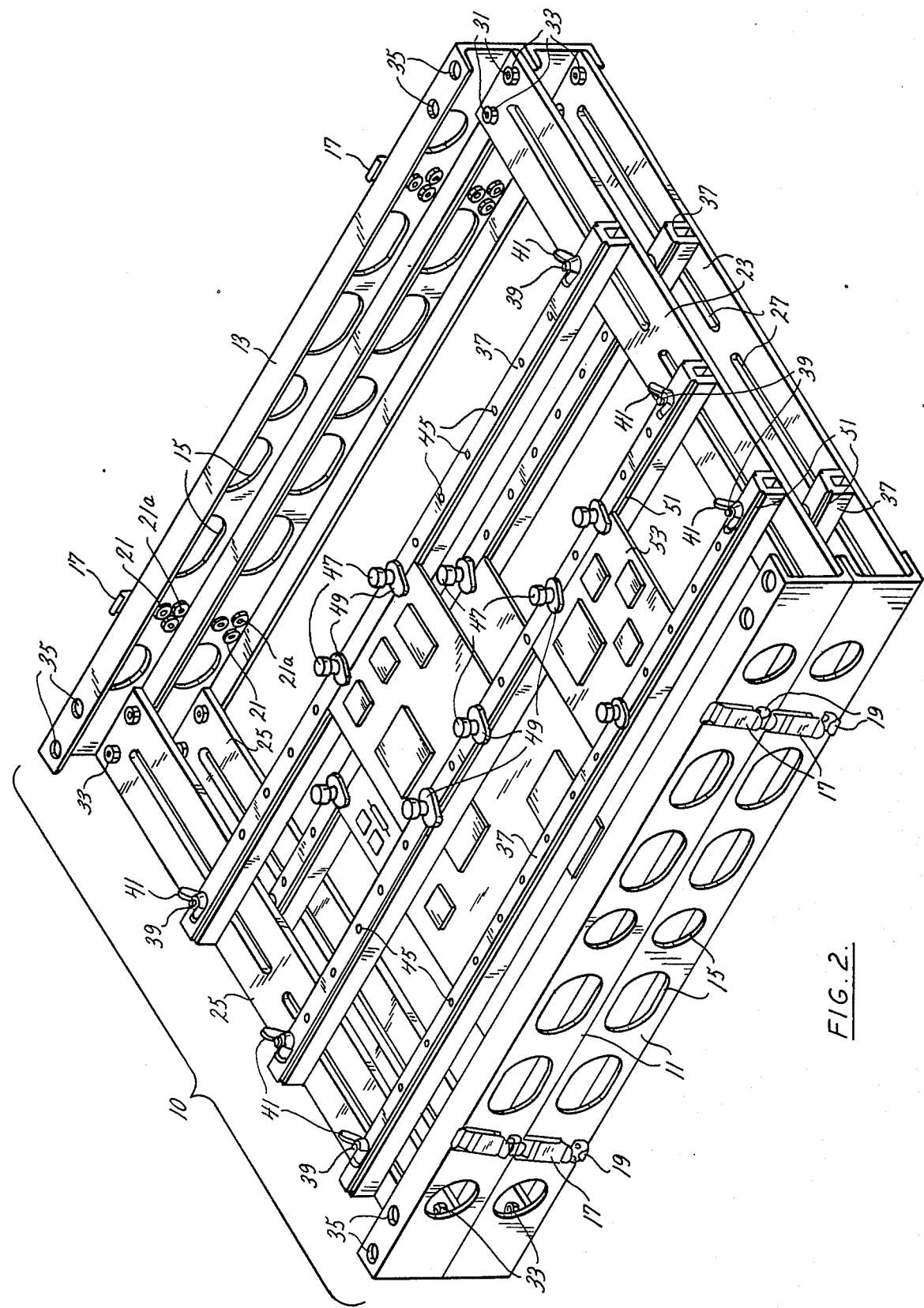
FIG. 2 is an perspective view two of the circuit board support devices of FIG. 1 illustrated in stacked mating alignment.

FIG. 2 illustrates two circuit board support devices 10 in the aforementioned attached arrangement. In this configuration, especially for a multiple stack of circuit board support devices 10, apertures 15 assume a role of greater necessity in insuring adequate ventilation to the circuit boards 53 secured within circuit board support devices 10.

Figure 3:
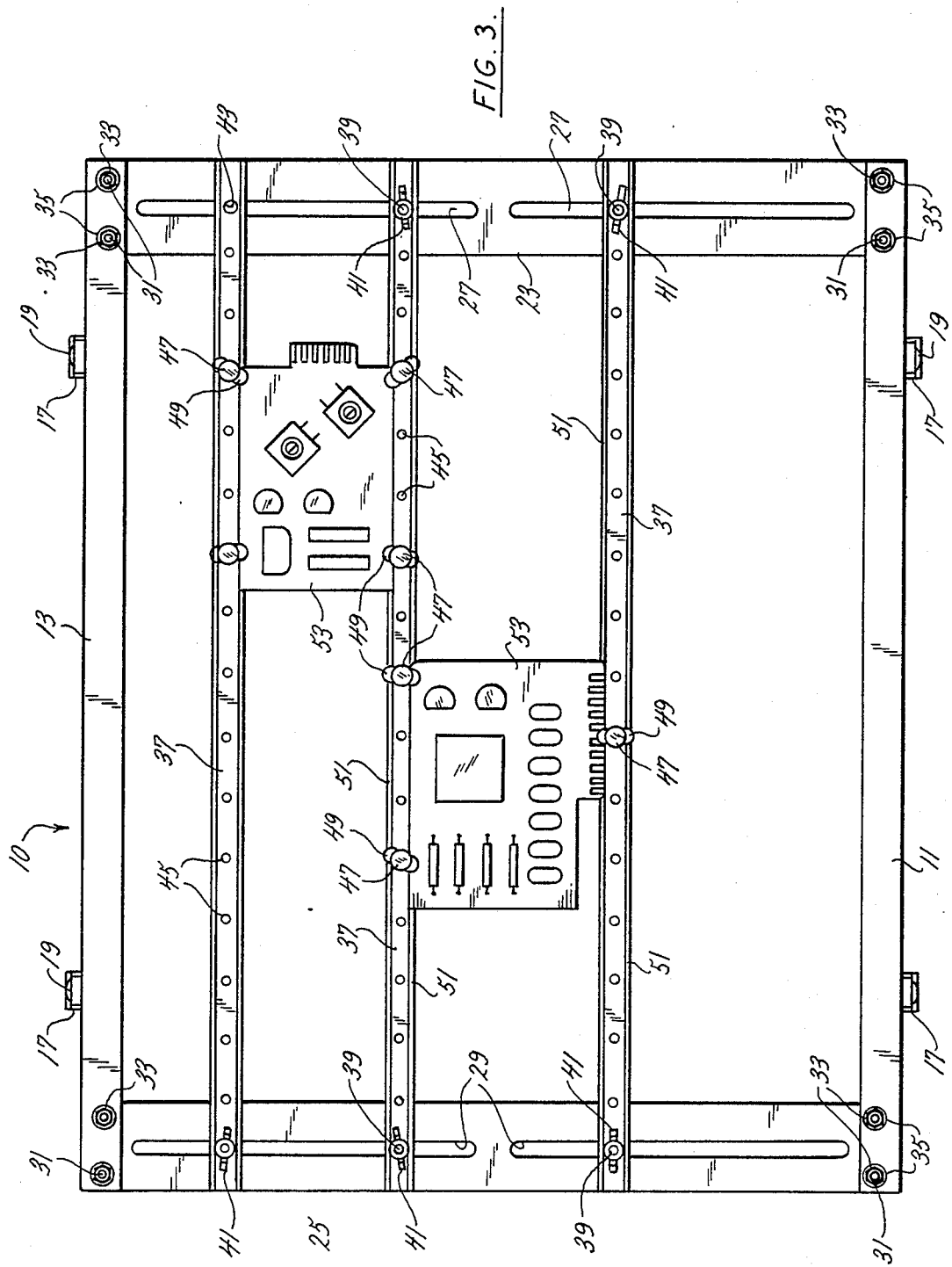
FIG. 3 is a top view of the of the circuit board support device of FIG. 1 illustrating the carriage of multiple circuit boards.

Referring to FIG. 3, a top view of the circuit board support device 10 is illustrated. FIG. 3 illustrates circuit board support bars 37 in position supporting two circuit boards 53. It is understood that as many or as few circuit board support bars as are necessary may be used to support as many circuit boards 53 as are fittable within circuit board support device 10.

Figure 4:
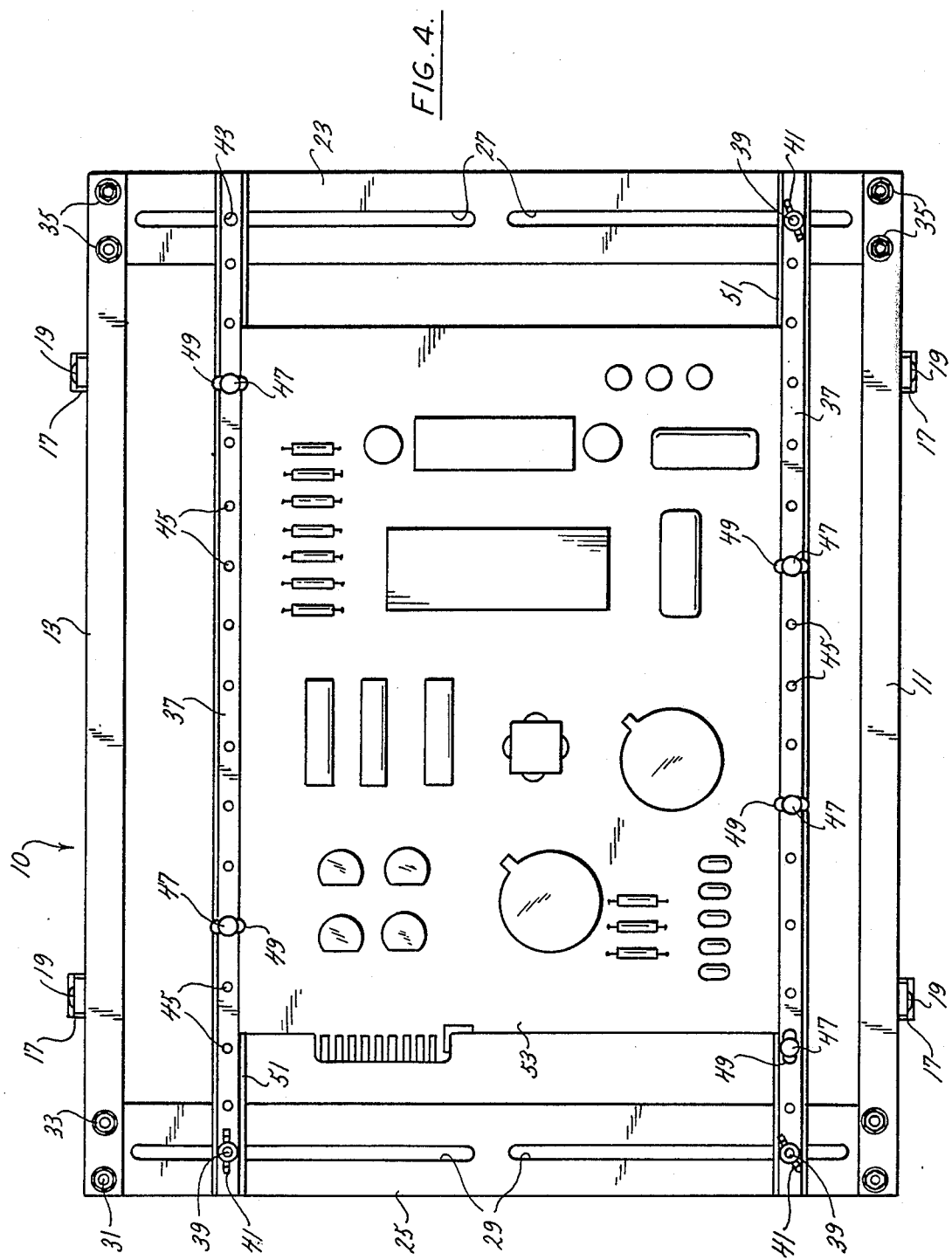
FIG. 4 is a top view of the of the circuit board support device of FIG. 1 illustrating the carriage of a single large circuit board; and, FIG. 5 is a end view of the circuit board support device of FIG. 1 illustrated with supported circuit boards.

Referring to FIG. 4, a top view of the circuit board support device 10 is illustrated supporting a single large circuit board 53. It is understood that circuit board support device 10 can be fabricated to any size necessary, and the only limitation concerning how many boards may be fixedly attached to a single circuit board support device 10 of a given size are the sizes of the circuit boards 53 sought to be supported therein.

Figure 5:
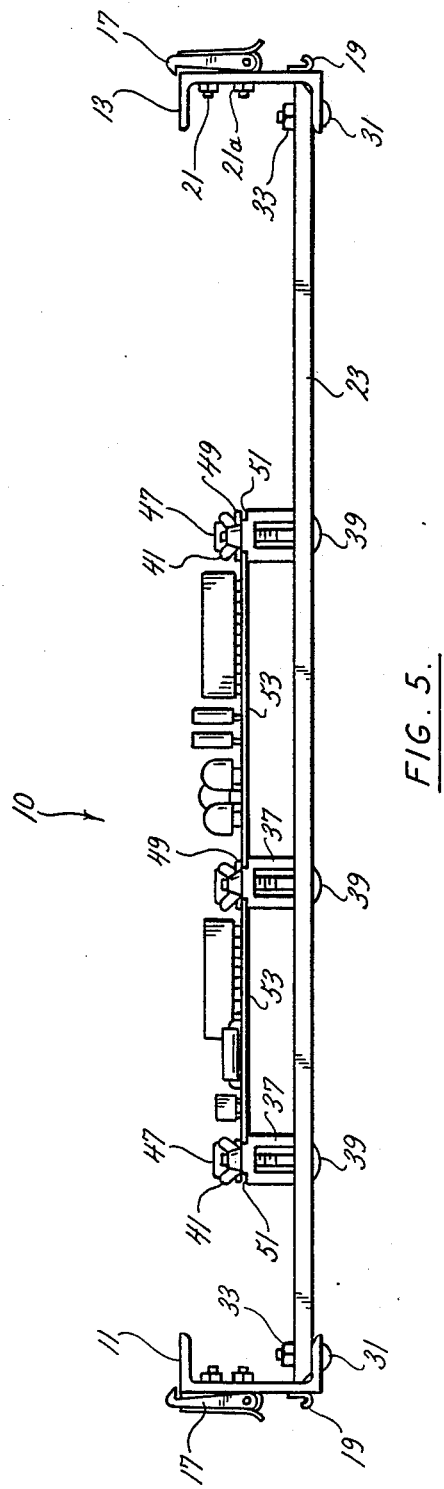

Referring to FIG. 5, an end view of the circuit board support device 10 is illustrated having three circuit board support bars 37 supporting two circuit boards 53. Note that the height of side support 11 and side support 13 provides an adequate protective clearance above the height of the two circuit boards 53 supported therebetween. As additional circuit board support devices 10 are sequentially stacked together, this clearance between the top of circuit boards 53 and the bottom of the next circuit board device 10 ensures the protection of the circuit elements supported on circuit board 53. The height of any circuit elements which would be supported by circuit board 53 would dictate the size and dimensions employed in the construction of circuit board support device 10.

The foregoing disclosure and description of the invention are illustrative and explanatory thereof, and various changes in the size, shape and materials, as well as in the details of the illustrated construction, may be made without departing from the spirit of the invention.

We claim:
1. A circuit board support device, comprising:
   side support means for providing vertical clearance and support having a series of apertures to facilitate handling and permit increased ventilation therethrough; said side support means further comprises a pair of elongate C shaped channels, having a top surface, a bottom surface and a side surface, said side surface having a multiplicity of apertures therethrough to permit increased ventilation, said bottom surface having a pair of bolt apertures at each end of said elongate C shaped channel to facilitate bolted attachment of said cross support means, said top surface having a pair of bolt head clearance apertures at each end of said elongate C shaped channel to facilitate placement of a circuit board support device atop another circuit board support device;
   cross support means, attached to said side support means, for rigidly joining said side support means; wherein said cross support means further comprise a pair of coplanar cross supports, each having a pair of elongate colinear slots near their center, and each having a pair of bolt apertures at each end to facilitate rigid attachment to said elongate C shaped channel;
   circuit board support means, supported by said cross support means, for providing a raised level of support; wherein said circuit board support means further comprises a multiplicity of U shaped channel members having a pair of sides and a base surface adjustable attachable to said pair of said elongate coplanar cross supports, said U shaped channel members having a series of internally threaded apertures along said base surface;
   circuit board fastening means, supported by said circuit board support means, for rigidly fastening a circuit board to said circuit board support means; wherein said circuit board fastening means further comprises a multiplicity of thumb bolts, each screwable securing a wing clamp into said internally threaded apertures of said U shaped channel members; and
   a circuit board secured to said U shaped channel member by said thumb bolt and said wing clamp.
2. The circuit board support device of claim 1 wherein said means for fastening at least two circuit board support devices together further comprises:
   at least one latch fixedly attached to said side surface of each of said pair of elongate C shaped channels; and,
   at least one hook, located adjacent to and below each said latch, said hook of a first said circuit board device lockable engagable to said latch of a second said circuit board device located below it, and said latch of said first circuit board device lockably engagable to said hook of a third said circuit board device located above it.
3. The circuit board support device of claim 2 wherein said elongate coplanar cross supports each share at least one coaxial bolt aperture with at least one of each said elongate C shaped channels, further comprising:
   at least one bolt extending through said bolt aperture of said elongate C shaped channel and through said bolt aperture of said elongate plates; and, at least one nut, threadable engaged with said bolt in order to rigidly attach said elongate coplanar cross supports to said elongate C shaped channel.

4. The circuit board support device of claim 3, wherein said elongate coplanar cross supports each share at least one coaxial bolt aperture with at least one of each of said circuit board support bars, further comprising:

at least one bolt extending through said bolt aperture of said circuit board support bar and through said bolt aperture of said elongate coplanar cross supports and, at least one nut, threadably engaged with said bolt in order to rigidly attach said circuit board suport bars to said elongate coplanar cross supports.

* * * * *